United States Patent [19]

Gottbreht et al.

[11] 4,304,976

[45] Dec. 8, 1981

[54] CAPACITIVE TOUCH SWITCH PANEL

[75] Inventors: Tom L. Gottbreht, Plano; Glen C. Shepherd, Garland, both of Tex.

[73] Assignee: Texas Instruments Incorporated, Dallas, Tex.

[21] Appl. No.: 105,802

[22] Filed: Dec. 20, 1979

Related U.S. Application Data

[63] Continuation of Ser. No. 887,387, Mar. 16, 1978, abandoned.

[51] Int. Cl.³ .................. H05B 6/64; H01G 7/00; H01H 9/54
[52] U.S. Cl. .................. 219/10.55 B; 219/10.55 R; 200/DIG. 1; 361/280; 340/365 C
[58] Field of Search .......... 219/10.55 R, 10.55 B, 219/10.55 C, 10.55 M, 506; 200/52 R, DIG. 1, 5 A, 268, 269, 292; 340/365 C; 361/280, 306, 313

[56] References Cited

U.S. PATENT DOCUMENTS

| | | | |
|---|---|---|---|
| 3,773,989 | 11/1973 | Halon | 200/DIG. 1 X |
| 3,819,906 | 6/1974 | Gould, Jr. | 219/506 |
| 3,911,234 | 10/1975 | Kotaka | 200/5 A |
| 3,971,013 | 7/1976 | Challoner et al. | 340/365 C X |
| 4,011,428 | 3/1977 | Fosnough et al. | 219/10.55 B |
| 4,028,509 | 6/1977 | Zurcher | 200/292 X |
| 4,056,699 | 11/1977 | Jordan | 200/5 A |
| 4,066,851 | 7/1978 | White et al. | 200/5 A |
| 4,083,038 | 4/1978 | Klebanoff | 361/306 X |
| 4,149,217 | 4/1979 | Tucker | 219/506 X |
| 4,161,766 | 7/1979 | Castleberry | 361/280 |

FOREIGN PATENT DOCUMENTS 54-127654 10/1979 Japan .................. 200/5 A

OTHER PUBLICATIONS

*Appliance Manufacturer*, Jul. 1975; Microprocessor Applications: Amana's Oven with a Brain; pp. 33-35.

*Primary Examiner*—Gene Z. Rubinson
*Assistant Examiner*—Keith E. George
*Attorney, Agent, or Firm*—John A. Haug; James P. McAndrews; Melvin Sharp

[57] ABSTRACT

An improved technique for the manufacture of capacitive touch switch panel assemblies, utilized to control appliances and the like, provides simplified construction and manufacture. The technique involves the formation of conductive touch pads on one major surface of a dielectric panel and the formation of pairs of spaced-apart conductive pads and conductive lead members to the conductive pads on a separate flexible synthetic resin sheet. The synthetic resin is bonded to the opposite major surface of the dielectric panel with each pair of conductive pads on the synthetic resin sheet in registry with a corresponding touch pad on the one major surface of the dielectric panel. The synthetic resin sheet includes a portion having a conductive lead pattern formed thereon which is not bonded to the dielectric panel; this portion serves as a flexible connector for connection of the touch panel to a circuit board or the like. In one embodiment, the conductive lead pattern includes an interconnection pattern for circuit elements such as integrated circuits or display elements mounted on the synthetic resin sheet or the dielectric panel. The conductive lead pattern on the synthetic resin sheet may be a single-layer or a multi-layer pattern and the conductors may be formed from a single material or different materials having predetermined resistive characteristics whereby external resistors to the capacitive touch switches and/or circuit elements may be eliminated from the circuit.

30 Claims, 11 Drawing Figures

CAPACITIVE TOUCH SWITCH PANEL

This is a continuation of application Ser. No. 887,387, filed Mar. 16, 1978 now abandoned.

BACKGROUND OF THE INVENTION

This invention relates to capacitive touch panel assemblies for controlling appliances and the like, and more particularly, to capacitive touch panels having conductive pads and leads formed on flexible synthetic resin sheets and to the method of making the same.

Capacitive touch panels have become widely used in consumer appliances such as microwave ovens, electric ranges and the like because of their ease of use and cleanability. Presently, touch panel assemblies are manufactured by forming a conductive touch pad on one surface of a glass panel and forming a pair of spaced-apart conductors on the opposite surface of the glass panel in registry with the touch pads on the one surface. Electrical contact to the spaced-apart conductors on the opposite surface of the glass panel requires the use of a complex arrangement of spring contact members affixed to a circuit board or the like. The circuit board is mounted so that it is held in registry with the glass panel and the spring contact members make electrical contact with corresponding ones of the conductors on the opposite surface of the glass panel. This arrangement is complex, relatively expensive to manufacture and generally requires the assembly to be thick enough to accommodate the glass panel, spring contact members and circuit board on which the spring contact members are mounted. Furthermore, for shatterproof protection, a synthetic resin film has been bonded to the back surface of the glass panel; holes are required to be formed in the synthetic resin film so that the spring contacts of the printed circuit board can make electrical contact with the conductors formed on the back surface of the panel.

It is therefore an object of the present invention to provide an improved capacitive touch switch panel assembly for appliances and the like.

Another object of the invention is to provide a capacitive touch switch panel having an improved means for providing electrical contact with the capacitive touch switch conductive pads.

A further object of the invention is to provide a capacitive touch switch panel assembly which is simpler, requires less parts and is therefore less expensive to manufacture.

Yet another object of the invention is to provide an improved method of manufacturing capacitive touch switch panels and assemblies.

It is another object of the invention to provide an improved capacitive touch-operated electronic controller for appliances and the like and an improved method for making the same.

It is a further object of the invention to reduce the number of external resistors required in electronic controllers with capacitive touch switch panels.

It is still another object of the invention to provide a capacitive touch switch panel with improved means for connection to a circuit board mounted at any desired angle with respect to the panel.

It is yet another object of the invention to provide a relatively thin capacitive touch switch panel assembly.

Yet a further object of the invention is to provide an electronic controller with capacitive touch switch panel having the switch conductors and electronic circuitry mounted on a single sheet of flexible film.

BRIEF DESCRIPTION OF THE INVENTION

These and other objects are accomplished in accordance with the present invention in which an improved capacitive touch panel and assembly is manufactured by forming conductive touch pads on one major surface of a dielectric panel and forming pairs of spaced-apart conductive pads and conductive lead members, including lead members connected to the conductive pads, on a separate sheet of flexible synthetic resin film. The synthetic resin sheet is then bonded to the opposite major surface of the dielectric panel with each pair of conductive pads on the synthetic resin sheet in registry with a corresponding touch pad on the one major surface of the dielectric panel. The flexible synthetic resin sheet includes at least a portion having a conductive lead pattern formed thereon which is not bonded to the dielectric panel; this flexible extension portion, which can be made to any desired length, serves as a flexible connector member for connection of the touch panel to a circuit board or the like. Furthermore, the circuit board may be mounted at any desired angle with respect to the dielectric panel to provide flexibility of design. The conductive lead members on the flexible extension portion may include terminal pads to be plugged directly into a flexible film connector socket located on the printed circuit board.

In one embodiment, tin oxide touch pads are formed on one major surface of a glass panel by vapor deposition techniques. Pairs of spaced-apart silver pads and silver lead members to the conductive pads are formed on a relatively thin flexible sheet of polyester material by silk screening of a silver epoxy material. The polyester sheet is then adhesively bonded to the opposite major surface of the glass panel with each pair of silver pads on the polyester sheet in registry with a corresponding tin oxide pad on the one major surface of the glass panel.

In a further embodiment, the conductive lead pattern includes an interconnection pattern for circuit elements such as semiconductor integrated circuit chips or display elements which are mounted either directly on the synthetic resin sheet or directly on the opposite major surface of the dielectric panel. The conductive lead pattern on the synthetic resin sheet may be a single layer formed on one major surface of the sheet, multi-layers provided by the formation of conductive patterns of both major surfaces of the sheet, or multi-layers formed by providing multiple patterned sheets or by folding a single sheet having a conductive pattern formed on one major surface of the sheet. Further additional layers of interconnects may be provided by stacking several sheets of the synthetic resin material or by multiple folding of one or more sheets.

In yet another embodiment, the conductive lead pattern on the synthetic sheet includes at least some leads formed of a relatively high resistive material such as resistive carbon paint whereby external resistors to the capacitive touch switches or other circuit elements may be eliminated from the circuit.

BRIEF DESCRIPTION OF THE DRAWINGS

Still further objects and advantages of the invention will become apparent from the detailed description and claims when read in conjunction with the accompanying drawings in which:

DETAILED DESCRIPTION OF PREFERRED EMBODIMENTS OF THE INVENTION

Figure 1:
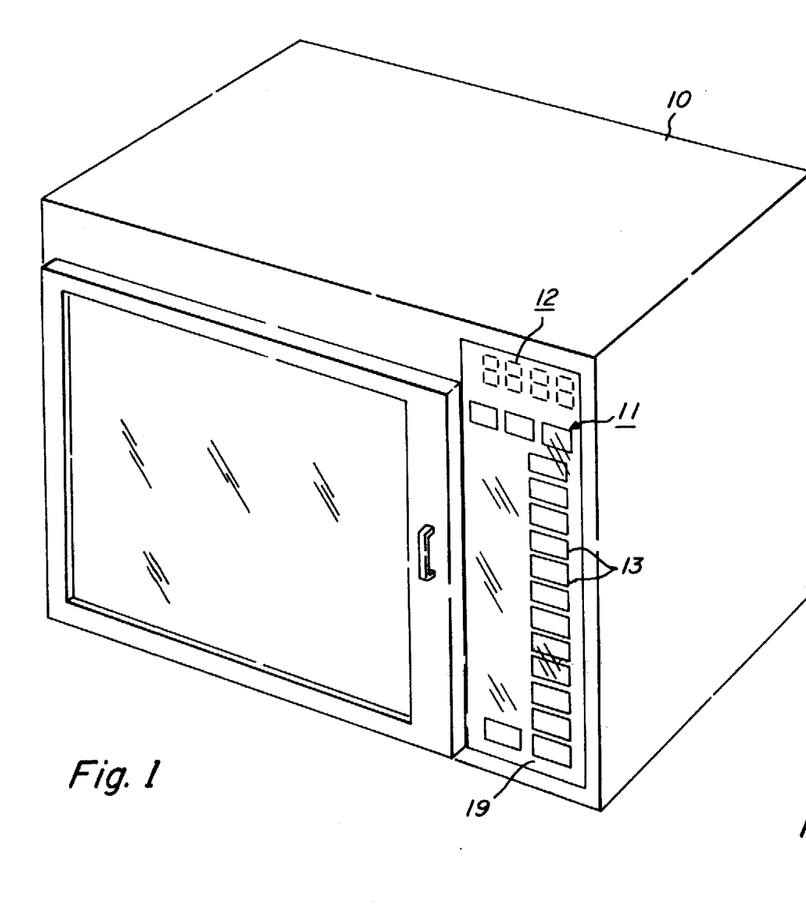
FIG. 1 is a front perspective view of an appliance incorporating a capacitive touch switch panel and assembly in accordance with the present invention.
Figure 2:
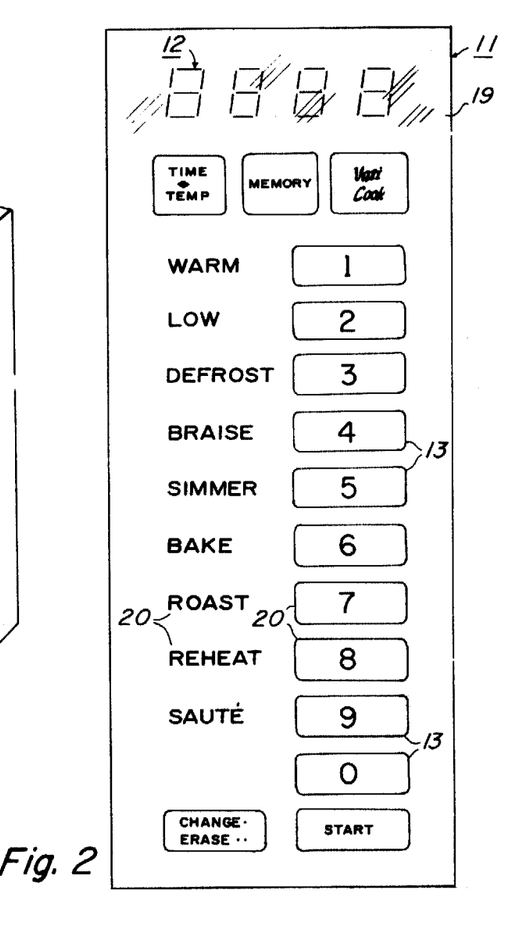
FIG. 2 is a front plan view of the capacitive touch switch panel of the appliance illustrated in FIG. 1.

Referring then to the drawings, and particularly, to FIGS. 1 and 2, an appliance such as microwave oven 10 includes an easily operated, easily cleanable capacitive touch switch panel assembly 11 in accordance with the present invention for controlling the time and temperature cycles of microwave oven 10. Assembly 11 includes a rigid dielectric front panel 19 which may be comprised of glass such as soda lime glass, plastic, such as Plexiglas material, or other suitable rigid dielectric material. Conductive touch pads 13 are formed on the outer surface of dielectric panel 19. Conductive touch pads 13 may be formed by silk screening, photolithography, vapor deposition or other process depending upon the conductive material selected. In one embodiment, for example, conductive tin oxide touch pads are formed on the front surface of a glass panel by vapor deposition from stannous fluoride which is sprayed over the glass panel at 1250° F. Indicator touch pad markings 20 may then be silk screened or painted on the glass and/or tin oxide pads. The dielectric panel may be transparent or opaque; the use of a transparent material allows a display 12 and/or indicator lights, mounted behind panel 19, to be visible from the front surface thereof.

Figure 3:
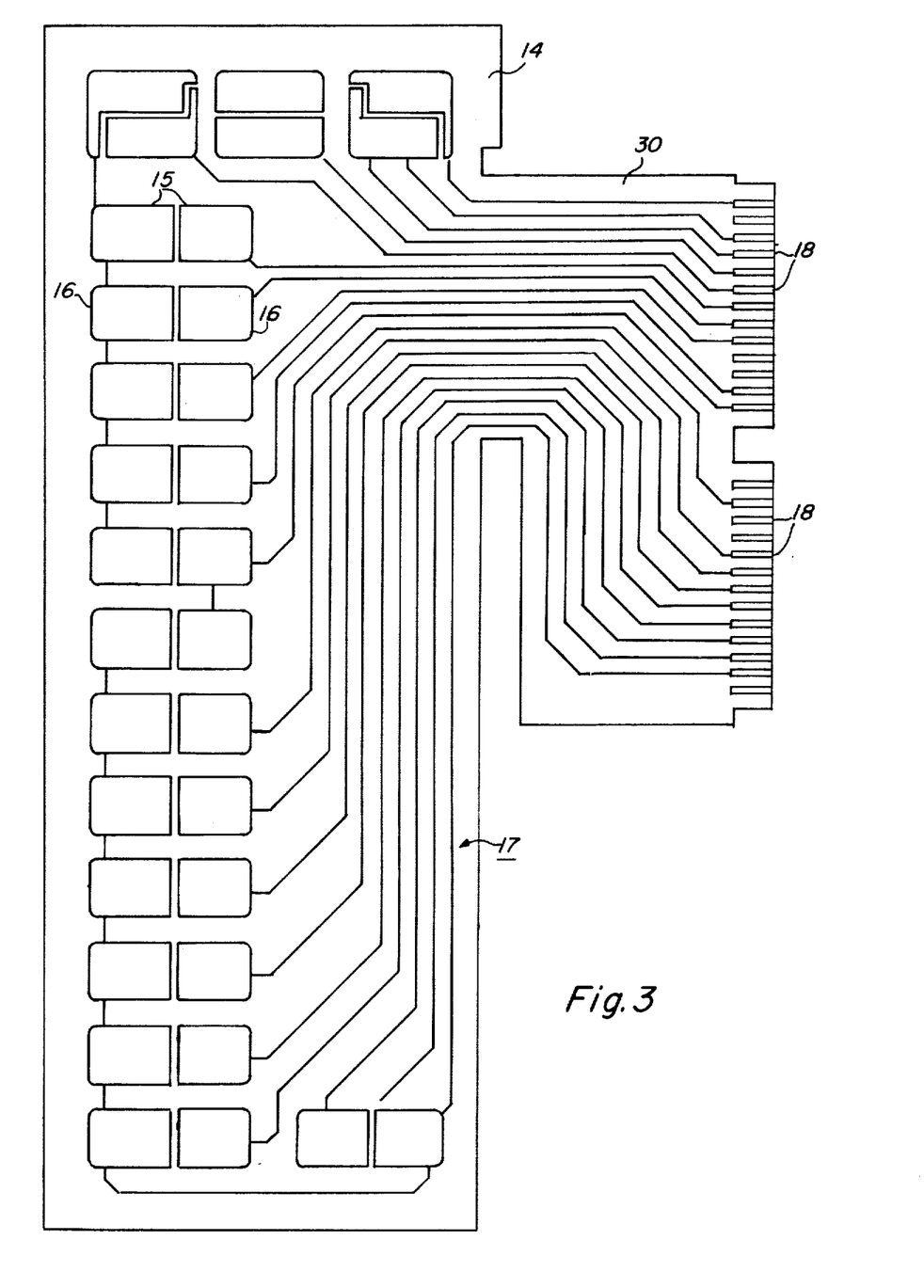
FIG. 3 is a back plan view of a patterned synthetic resin sheet which is bonded to the back surface of the dielectric panel of FIG. 2 in accordance with the present invention.

Referring to FIG. 3, pairs of spaced-apart conductive pads, i.e. 15, 16, etc., and conductive lead members 17, which includes conductive lead members to conductive pads 15, 16, etc., are formed on flexible synthetic resin sheet 14. This may be accomplished by vapor deposition of aluminum, silver, gold or other conductive material or by depositing silver epoxy or other conductive material by photolithographic or silk screening techniques or by painting on conductive paint. Also, less conductive materials than those listed above, such as resistive carbon paint, may be utilized to form leads having a desired resistance between conductive pads 15, 16, etc. and the circuit components to which they are to be connected. In one embodiment, for example, external resistors on the order of about 10,000 ohms, utilized to connect each capacitive touch switch to a semiconductor integrated input circuit, are eliminated by forming leads 17 from a resistive carbon material, each lead patterned to a particular length and width which provides a nominal resistance path of near 10,000 ohms.

Synthetic resin sheet 14 is die cut and then bonded to the rear major surface of dielectric panel 19 utilizing, for example, a suitable adhesive material. Synthetic sheet 14 is bonded to the dielectric panel so that each of the pairs of conductive pads 15, 16, etc., on synthetic sheet 14, are in registry with a corresponding touch pad 13 on the front surface of dielectric panel 19. Synthetic resin sheet 14 may be comprised of a polyester, polycarbonate, polyimide or other synthetic dielectric resin film suitable for carrying electrically conductive leads. In one example, a 2- to 20-mil thick, nominally 7-mil, polyester sheet, having silk-screened silver epoxy conductive pads and conductive leads formed thereon, is bonded by a 2- to 20-mil thick layer of 3M Company, 918 adhesive onto the rear surface of a ⅛"-thick soda lime glass panel.

It should be noted that the synthetic resin sheet provides shatter-proof protection to the glass panel as well as carrying the conductive pads and leads.

As illustrated in FIG. 3, synthetic resin sheet 14 includes a portion 30 having at least part of conductive lead pattern 17 formed thereon which portion is not bonded to dielectric panel 19; portion 30 serves as a flexible connector for connection of the touch panel to a circuit board or the like as will henceforth be described in detail.

Figure 4A:
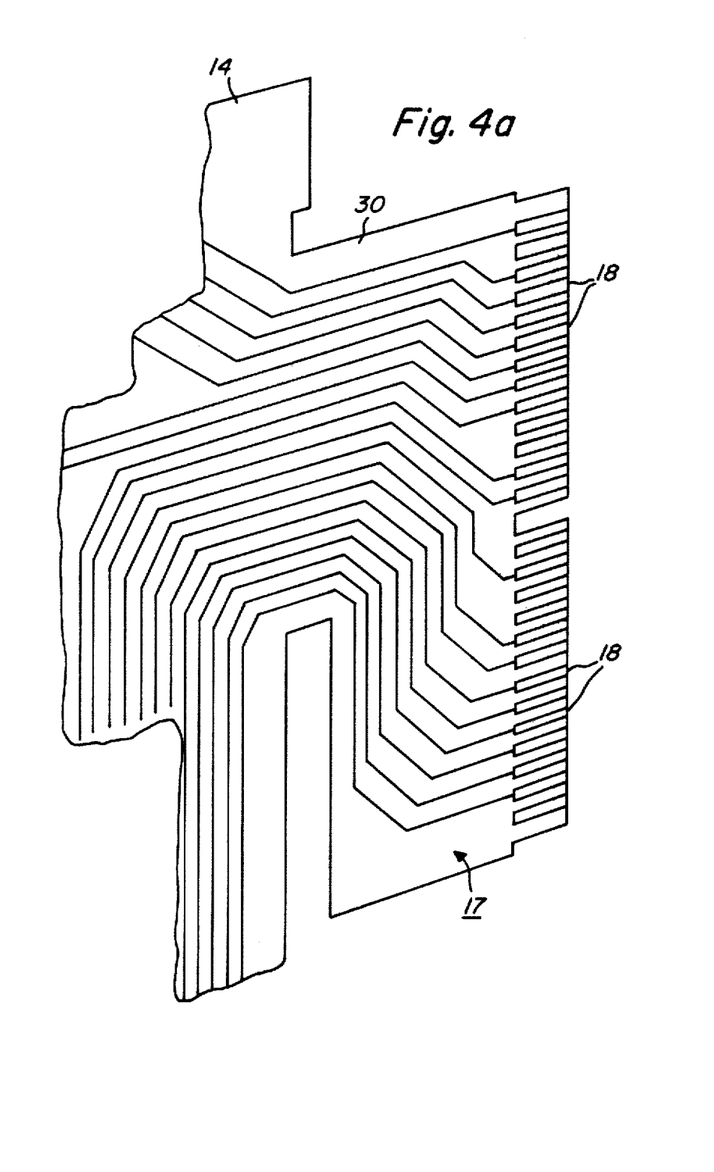
FIGS. 4a–4c are views in perspective illustrating the manner in which the patterned flexible synthetic resin sheet of FIG. 3 may be folded to provide a multi-layer conductive pattern.
Figure 4B:
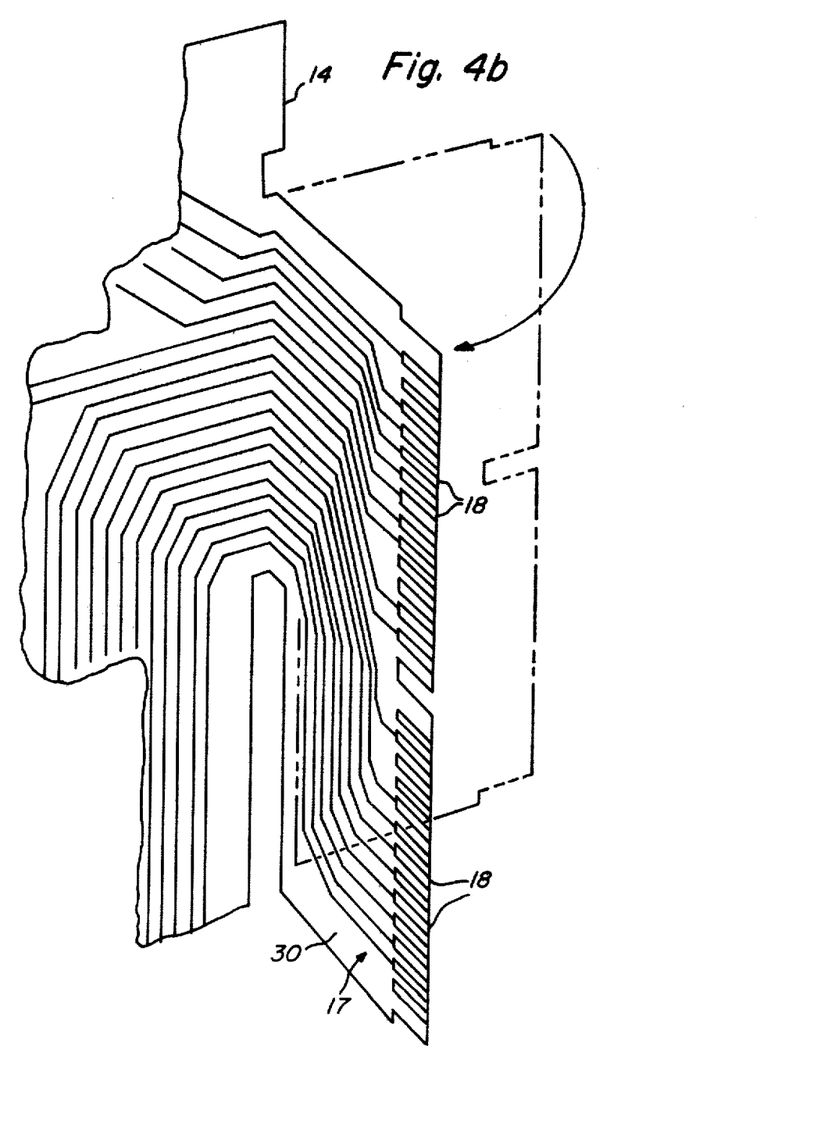
Figure 4C:
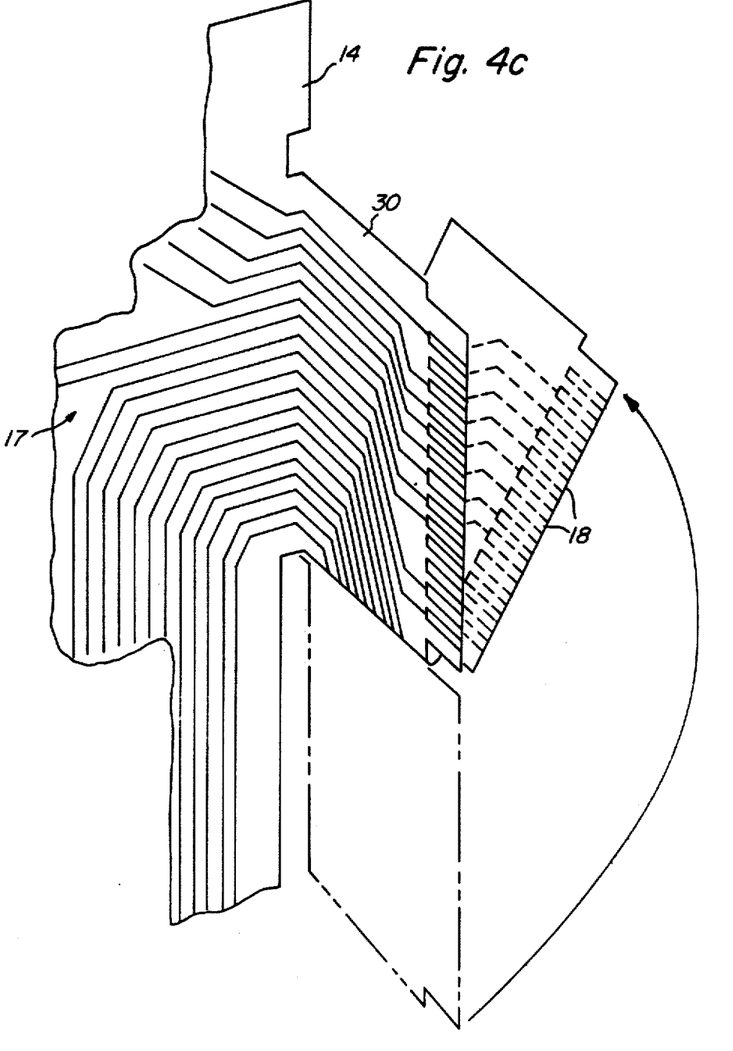

As previously mentioned, the conductive lead pattern on the synthetic resin sheet may be in a single layer formed on one surface thereof or multi-layers formed on opposite major surface thereof. Furthermore, multi-layer patterns may be formed either by stacking several of the flexible sheets or by folding a single sheet having a conductive lead pattern formed on one major surface thereof. This latter technique is illustrated, for example, in FIGS. 4a–4c where extension portion 30, providing the flexible connector means for connection of the touch panel to a circuit board, is folded as to provide multi-layer patterns of conductors both terminating with terminal pads 18.

Figure 5:
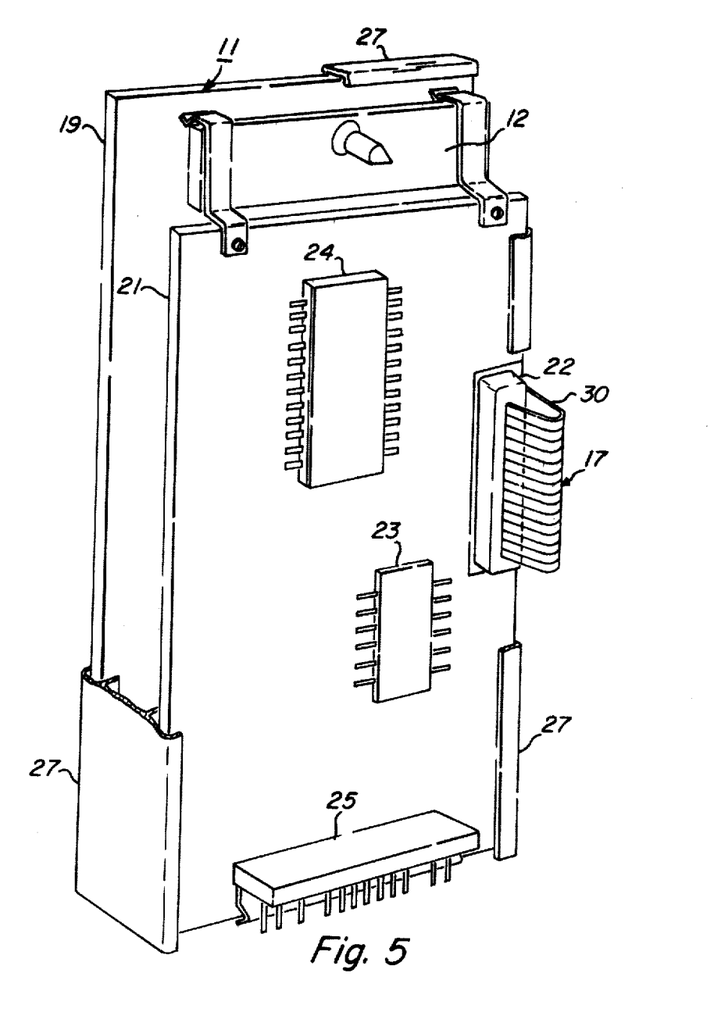
FIG. 5 is a back perspective view of the capacitive touch switch panel assembly of the appliance illustrated in FIG. 1.
Figure 6:
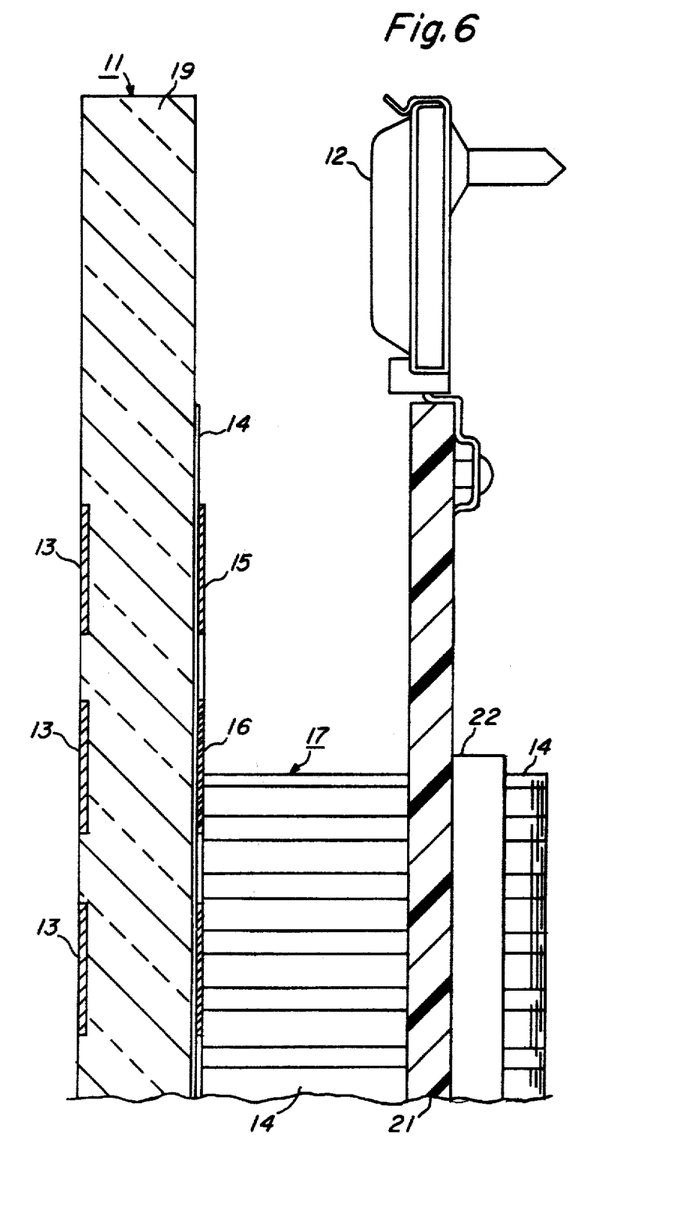
FIG. 6 is a cross-sectional side view of the assembly of FIG. 5.

Since extension portion 30 is flexible, the circuit board or other circuit component mounting means, to which the touch panel switches are electrically connected, may be mounted at any desired angle with respect to dielectric panel 19 (e.g. parallel, 90 degrees, etc.) or may be completely detached and remote. Referring to FIG. 5, circuit board 21 having an input circuit 23 and an integrated microprocessor circuit 24 mounted thereon along with a digital vacuum flourescent display device 12 is mounted by means of a suitable mounting frame 27 in parallel relation to the rear surface of the dielectric panel. Circuit board 21 includes a flexible film connection socket 22 in which extension portion 30 is inserted, socket 22 having conductive spring clip members which make electrical connection with terminal pads 18. Another connector means 25, mounted on circuit board 21 is utilized for connection of the circuit board to other components of the microwave oven 10; i.e., a door latch switch, a power supply, a magnetron tube, etc.

Figure 7:
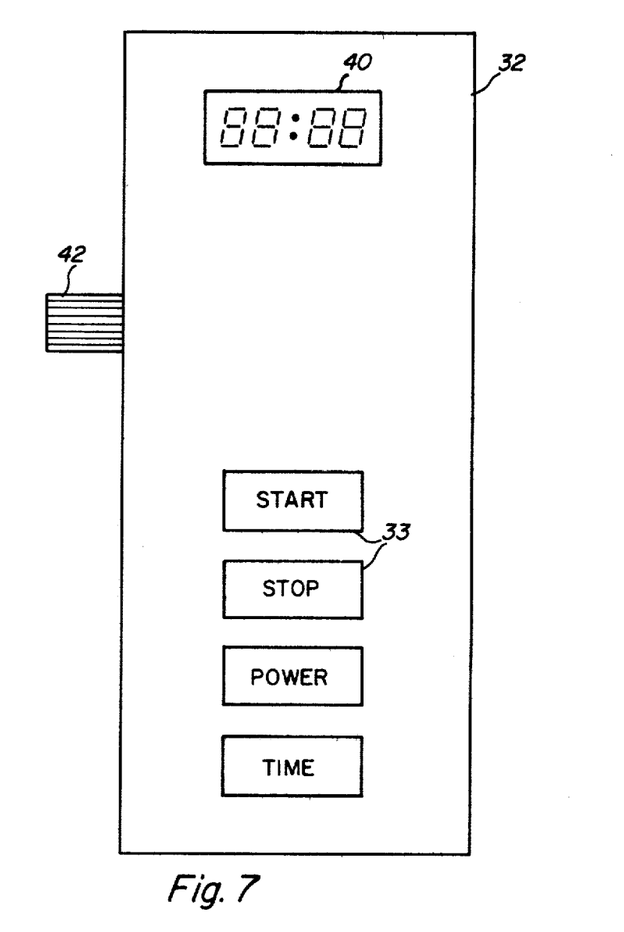
FIG. 7 is a front plan view of another embodiment of capacitive touch switch assembly in accordance with the present invention.
Figure 8:
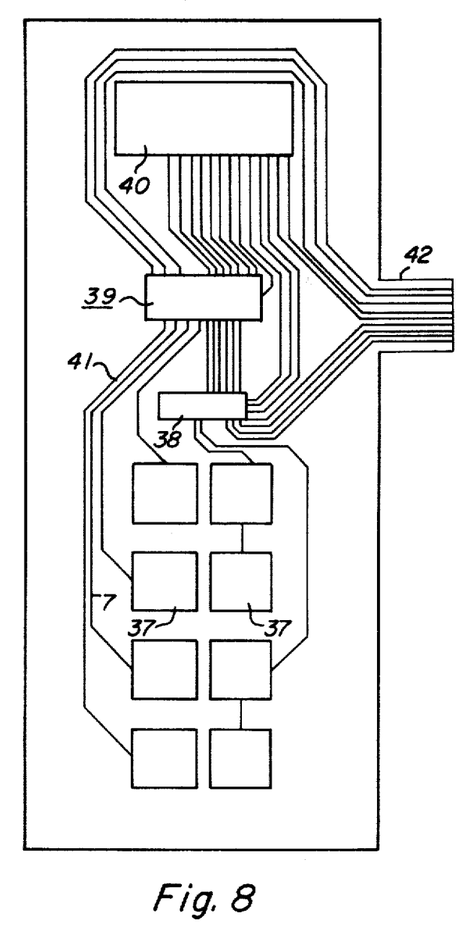
FIG. 8 is a rear planar view of a synthetic resin sheet utilized in the embodiment of FIG. 7 in which integrated circuits and display elements are mounted directly on the synthetic resin film and in which an interconnection pattern for the circuits and display elements are formed directly on the synthetic resin sheet.
Figure 9:
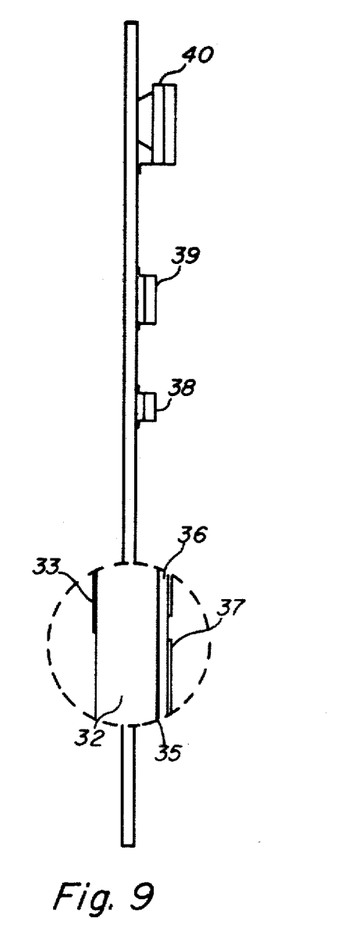
FIG. 9 is a cross-sectional side view of the capacitive touch switch panel assembly of FIG. 7.

Another embodiment of the invention is illustrated in FIGS. 7-9. In this embodiment, the circuit board is completely eliminated by mounting the semiconductor integrated electronic circuit and display elements directly on the flexible synthetic resin sheet thereby providing an extremely thin, versatile and inexpensive capacitive touch switch panel assembly. As shown in FIG. 7, rigid dielectric panel 32 has conductive touch pads 33 formed on the front surface thereof as previously discussed. Dielectric panel 32 is transparent to allow display 40, which is mounted at the rear of panel 32, to be visible from the front surface thereof.

As illustrated in FIG. 8, a flexible synthetic resin sheet 36 having an extension portion 42 includes pairs of conductive pads, i.e. 37, formed on a major surface thereof. Conductive lead members 41 are also formed on at least one major surface of sheet 36 to provide electrical connection paths between the conductive pads 37 and the semiconductor integrated input circuit 38, between integrated circuit 38 and a semiconductor integrated microprocessor circuit 39 and between integrated circuit 39 and a digital display means 40. Integrated circuits 38 and 39 and display means 40 are all mounted on flexible synthetic sheet 36 by means of solder or other connection means affixing the leads thereof to the conductive lead members 41. Conductive lead members 41 also extend along extension portion 42 to provide a flexible connector of desired length to connect the external circuitry for control by microprocessor circuit 39 which sends and receives control signals via the leads on extension portion 42.

Flexible sheet 36 is bonded to rigid dielectric panel 32 by means of an adhesive layer 35 with the pairs of conductive pads 37 in registered alignment with respective ones of the conductive touch pads 33 to provide a plurality of capacitive touch switches.

In alternate embodiments, integrated circuits 38 and 39 and/or display means 40 may be mounted on the rear surface of dielectric panel 32 and connected to conductive lead members 41.

Various embodiments of the present invention have now been described in detail. Since it is obvious that many changes and modifications can be made in the above-described details without departing from the nature and spirit of the invention, it is understood that the invention is not to be limited to said details except as set forth in the appended claims.

What is claimed is:

1. A capacitive touch switch panel comprising:
   (a) a rigid dielectric panel having conductive touch pads on one major surface thereof;
   (b) a flexible dielectric synthetic resin sheet having first and second opposite major surfaces and having pairs of spaced-apart conductive pads and conductive leads extending to said conductive pads on said first major surface thereof, at least one portion of said second major surface of said flexible sheet being bonded to the opposite major surface of said dielectric panel with each of said pairs of spaced-apart conductive pads in registration with a respective one of said conductive touch pads and at least another portion of said flexible sheet not being bonded to said dielectric panel, said another portion having at least some of said conductive leads extending thereon for external connection to said capacitive touch switch panel.

2. The switch panel according to claim 1 wherein at least some of said conductive lead members are comprised of resistive carbon.

3. The switch panel according to claim 1 including a circuit element having connection terminals mounted on said synthetic resin sheet, the connection terminals of said circuit element being electrically connected to respective ones of said conductive lead members.

4. The switch panel according to claim 3 wherein said circuit element is a semiconductor integrated circuit.

5. The switch panel according to claim 3 wherein said circuit element is a digital display element.

6. The switch panel according to claim 3 wherein said circuit element is a panel indicator display element.

7. The switch panel according to claim 1 including a circuit element having connection terminals mounted on said opposite major surface of said dielectric panel, the connection terminals of said circuit element being electrically connected to respective ones of said conductive leads on said synthetic resin sheet.

8. The switch panel according to claim 7 wherein said circuit element is a semiconductor integrated circuit.

9. The switch panel according to claim 7 wherein said circuit element is a digital display element.

10. The switch panel according to claim 7 wherein said circuit element is a panel indicator display element.

11. The switch panel according to claim 1 wherein said synthetic resin sheet includes conductive leads on both major surfaces thereof.

12. The switch panel according to claim 1 wherein a portion of said flexible sheet is folded over another portion thereof to provide multi-layers of said conductive lead members with said flexible sheet providing a layer of insulation between said conductive lead members.

13. A capacitive touch switch panel assembly comprising:
   (a) a rigid dielectric panel having conductive touch pads on one major surface thereof;
   (b) a flexible dielectric synthetic resin sheet having first and second opposite major surfaces and having pairs of spaced-apart conductive pads and conductive leads extending to said conductive pads on said first major surface thereof, at least one portion of said second major surface of said flexible sheet being bonded to the opposite major surface of said dielectric panel with each of said pairs of said spaced-apart conductive pads on said sheet being in registration with a respective one of said conductive touch pads on said dielectric panel and at least another portion of said flexible sheet not being bonded to said dielectric panel, said another portion having at least some of said conductive leads extending thereon;
   (c) a circuit board including a pattern of electrical conductors on at least one major surface thereof;
   (d) mounting means for mounting said rigid dielectric panel and circuit board in fixed relation with respect to each other, the conductive leads formed on said at least another portion of said flexible sheet being electrically connected to respective electrical conductors located on said printed circuit board.

14. The assembly according to claim 17 wherein said circuit board includes a socket member mounted thereon and said at least another portion of said flexible sheet is plugged into said socket member to provide electrical connection therebetween.

15. The assembly according to claim 13 wherein said dielectric panel is comprised of glass and wherein said conductive touch pads are comprised of tin oxide.

16. The assembly according to claim 15 wherein said synthetic resin sheet is comprised of a polyester material.

17. The assembly according to claim 13 wherein said spaced-apart conductive pads are comprised of silver.

18. The assembly according to claim 13 wherein at least some of said conductive leads are comprised of resistive carbon to provide a path of predetermined resistance.

19. The assembly according to claim 13 wherein said circuit board is mounted in parallel relation to said dielectric panel.

20. An appliance controller with capacitive touch switch panel comprising:
  (a) a capacitive touch switch panel including:
    (i) a rigid dielectric panel having at least one transparent portion,
    (ii) conductive touch pads on one major surface of said dielectric panel, and
    (iii) a flexible dielectric synthetic resin sheet having first and second opposite major surfaces and having pairs of spaced-apart conductive pads and conductive leads extending to said conductive pads on said first major surface thereof, at least one portion of said second major surface of said flexible sheet being bonded to the opposite major surface of said dielectric panel with each of said pairs of spaced-apart conductive pads on said sheet in registration with a respective one of said conductive pads on said dielectric panel and at least another portion of said flexible sheet not bonded to said dielectric panel having at least some of said conductive leads extending thereon;
  (b) a circuit board having a semiconductor integrated circuit microprocessor, digital display means and a socket member mounted thereon, said circuit board including a conductive lead pattern interconnecting said microprocessor, said digital display means and said socket member; and
  (c) mounting means for mounting said touch switch panel and said circuit board in parallel relation to each other, said digital display means being visible through said at least one transparent portion of said dielectric panel, said another portion of said flexible sheet being plugged into said socket member to provide electrical connection between said touch switch panel and circuit board.

21. The appliance controller according to claim 20 including a second socket member mounted on said circuit board for connection of said controller to external circuit elements.

22. The appliance controller according to claim 21 wherein said appliance is a microwave oven and said external circuit elements include a magnetron tube.

23. The appliance controller according to claim 22 wherein said controller controls the time and temperature cycles of said microwave oven.

24. The appliance controller according to claim 21 wherein said appliance is an electric range and said controller controls the heating elements thereof.

25. The appliance controller according to claim 26 including at least one indicator light mounted on a said circuit board, said indicator light being visible through said dielectric panel.

26. An appliance controller with capacitive touch switch panel comprising:
  (a) a rigid dielectric panel having conductive touch pads on one major surface thereof;
  (b) a flexible dielectric synthetic resin sheet having first and second opposite major surfaces and having pairs of spaced-apart conductive pads and conductive leads extending to said conductive pads on said first major surface thereof, at least one portion of said second major surface of said flexible sheet being bonded to the opposite major surface of said dielectric panel with each of said pairs of spaced-apart conductive pads on said sheet in registration with a respective one of said conductive pads on said dielectric panel and at least another portion of said flexible sheet not bonded to said dielectric panel having at least some of said conductive leads extending thereon for connection of said controller to external circuit elements; and
  (c) a semiconductor integrated circuit microprocessor and digital display means mounted on said flexible sheet with said conductive leads interconnecting said microprocessor and said digital display means.

27. The appliance controller according to claim 26 wherein said dielectric panel includes a transparent portion and said flexible sheet having digital display elements mounted thereon which is connected to said conductive leads, said display elements being visible through said at least one transparent portion of said dielectric panel.

28. The appliance controller according to claim 26 wherein said appliance is a microwave oven and said external circuit elements include a magnetron tube.

29. The appliance controller according to claim 28 wherein said controller controls the time and temperature cycles of said microwave oven.

30. The appliance controller according to claim 26 wherein said appliance is an electric range and said controller controls the heating elements thereof.

* * * * *